United States Patent
Huang et al.

(10) Patent No.: US 12,283,532 B2
(45) Date of Patent: Apr. 22, 2025

(54) SEMICONDUCTOR STRUCTURE AND METHOD OF MANUFACTURE

(71) Applicant: Taiwan Semiconductor Manufacturing Co., Ltd., Hsinchu (TW)

(72) Inventors: Yao-Te Huang, Hsinchu (TW); Liang-Chor Chung, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 291 days.

(21) Appl. No.: 17/866,807

(22) Filed: Jul. 18, 2022

(65) Prior Publication Data
US 2022/0352043 A1 Nov. 3, 2022

Related U.S. Application Data

(62) Division of application No. 16/888,177, filed on May 29, 2020, now Pat. No. 11,443,991.

(51) Int. Cl.
*H01L 21/66* (2006.01)
*H01L 21/768* (2006.01)

(52) U.S. Cl.
CPC ........ *H01L 22/34* (2013.01); *H01L 21/76813* (2013.01); *H01L 21/7684* (2013.01); *H01L 21/76895* (2013.01)

(58) Field of Classification Search
CPC ............... H01L 22/34; H01L 21/76813; H01L 21/7684; H01L 21/76895; H01L 22/32; H01L 21/768; H01L 21/76838; H01L 22/30
See application file for complete search history.

(56) References Cited

U.S. PATENT DOCUMENTS

| | | | |
|---|---|---|---|
| 7,714,443 B2 | 5/2010 | Chen et al. | |
| 8,450,126 B2 | 5/2013 | Chen et al. | |
| 2003/0102475 A1 | 6/2003 | Kwon et al. | |
| 2008/0020559 A1 | 1/2008 | Chen et al. | |
| 2011/0287627 A1* | 11/2011 | Chen | ...................... H01L 24/05 438/622 |
| 2017/0345772 A1 | 11/2017 | Jackson et al. | |

* cited by examiner

*Primary Examiner* — Thanhha S Pham
(74) *Attorney, Agent, or Firm* — Slater Matsil, LLP

(57) ABSTRACT

Test pad structures and methods of forming a test pad are described herein. A method for forming a test pad includes forming a device element over a substrate, depositing a dielectric layer over the device element and the substrate, and etching openings in the dielectric layer to a first depth. Once the openings have been formed, a conductive material is deposited in the openings and followed by a chemical mechanical planarization to form a first grid feature and a panel region of the test pad, the first grid feature extending lengthwise from the panel region to a perimeter of the test pad. Once formed, a probe may be used to contact the panel region of the test pad during a wafer acceptance test (WAT) and/or a process control monitoring (PCM) test of the device element.

20 Claims, 5 Drawing Sheets

SEMICONDUCTOR STRUCTURE AND METHOD OF MANUFACTURE

PRIORITY CLAIM AND CROSS-REFERENCE

This application is a divisional of U.S. patent application Ser. No. 16/888,177, filed on May 29, 2020, entitled "Semiconductor Structure and Method of Manufacture," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. Furthermore, as more components are integrated into a given area, sophisticated three-dimensional (3D) integrated circuit (3DIC) packaging techniques may be employed to further improve integration density such that even complex systems may be integrated into 3DIC devices. However, as the minimum features sizes are reduced and as more complex systems are integrated into 3DIC devices, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
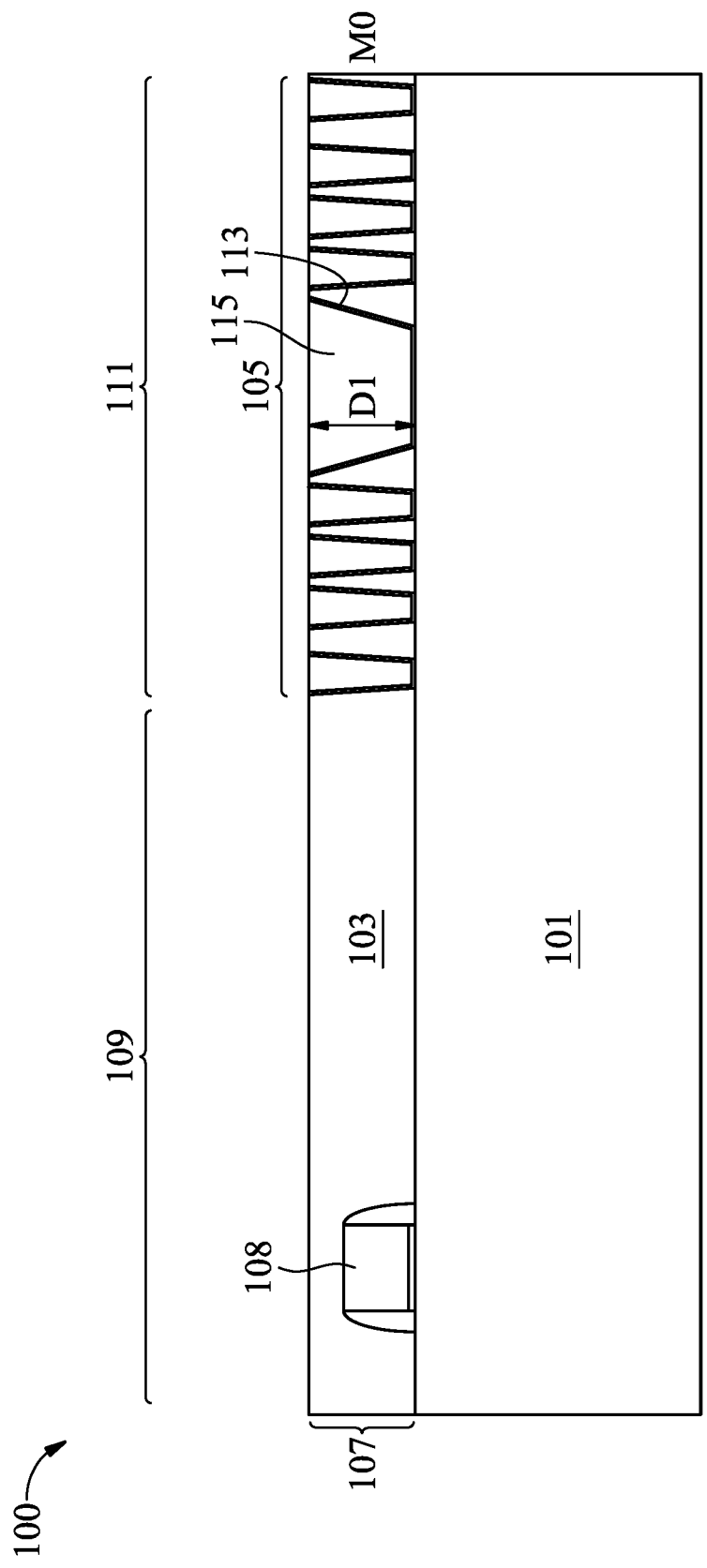
FIG. 1A illustrates a cross-sectional view of forming a test pad within a semiconductor wafer at an intermediate step of manufacturing semiconductor dies.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As complexity increases for system integrated into a 3DIC device, the importance of verifying proper electrical connectivity through the metallization layers and identifying known good dies increases during fabrication of the 3DIC device. Accordingly, test pads (e.g., wafer acceptance test (WAT) pads, bumping pads, or the like) may be incorporated into different metallization layers of the devices to aid in the verification testing of features within the 3D packaging and/or 3DIC devices. The test pads may be formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A illustrates a cross-sectional view of a semiconductor wafer 100 in an intermediate step of manufacturing semiconductor dies. In particular, FIG. 1A illustrates forming a first test pad 105 in a first interconnect layer 107 of the semiconductor wafer 100, in accordance with some embodiments. Device elements 108 are formed in and/or over a semiconductor substrate 101 in a device region 109 of the semiconductor wafer 100. The first interconnect layer 107 is formed over the device elements 108 and the semiconductor substrate 101 and may also be referred to herein as a bottom metallization layer M0. According to some embodiments, the first test pad 105 is formed in the first interconnect layer 107 and may be located, for example, within a scribe line region 111 of the semiconductor wafer 100.

In other embodiments, however, the first test pad 105 may be located in other suitable areas such as within device region 109 of the semiconductor wafer 100. For example, the first test pad 105 may be located within a test region of a semiconductor die between contact pads and a seal ring of the semiconductor die. Any suitable location may be utilized.

The first test pad 105 is electrically coupled through the first interconnect layer 107 to one or more of the device elements 108 and allows for in situ testing of one or more of the device elements 108 during manufacturing of the semiconductor wafer 100. For example, the first test pad 105 may be used to facilitate wafer acceptance testing (WAT) and/or circuit probe (CP) testing for process control monitoring (PCM). The WAT may be performed to analyze the success of the wafer fabrication process at various stages of fabrication and attempt to determine the cause of any fabrication deficiencies. The CP (circuit probe) test involves using one or more probes to determine which die are good and which are not.

In an embodiment the semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

As one of ordinary skill in the art will recognize, a wide variety of devices including active devices and passive devices such as transistors, diodes, capacitors, resistors, combinations of these, and the like may be formed to provide desired structural and functional requirements of the design for the semiconductor wafer 100. The device elements 108 may be formed in and/or over the semiconductor substrate 101 using various processes including deposition, etching, implantation, photolithography, annealing, and/or other suitable processes.

The first interconnect layer 107 comprises one or more dielectric layers 103 is formed over the device elements 108 and the semiconductor substrate 101 to isolate and protect the device elements 108. In some embodiments, at least one of the dielectric layers 103 is formed of low-k dielectric materials having k values, for example, lower than about 4.0. In some embodiments, the dielectric layers 103 may be made of, for example, boron phosphorous silicate glass (BPSG), carbon doped oxides, silicon oxide, porous carbon doped silicon dioxide, silicon oxide, silicon nitride, SiCOH, a polymer such as polyimide, combinations of these, or the like and may be deposited by chemical vapor deposition (CVD), physical vapor deposition (PVD), combinations of these, or the like. The dielectric layers 103 may be formed through a process such as a spin-on process, a chemical vapor deposition (CVD), PECVD, LPCVD, physical vapor deposition (PVD), combinations of these, or the like. The one or more dielectric layers 103 may be formed to have a thickness of between about 100 Å and about 3000 Å, such as about 600 Å. However, any suitable materials, any suitable processes, and any suitable thicknesses may be utilized.

FIG. 1A further illustrates the first test pad 105 can be formed in the first interconnect layer 107 and, for example, located within the scribe line region 111 of the semiconductor wafer 100, in accordance with some embodiments. The first test pad 105 is electrically coupled through the first interconnect layer 107 by one or more of the conductive features to one or more of the device elements 108. The first test pad 105 allows for testing of a desired integrated circuit to be performed in situ, at an intermediate step of manufacturing the semiconductor wafer 100, prior to forming a subsequent metallization layer over the first interconnect layer 107. As such, WAT and/or CP tests may be performed to analyze the success of the wafer fabrication process and to determine which die are good and which are not, for example, at the bottom metallization layer M0.

According to some embodiments, the first test pad 105 is formed using a dual damascene process to initially form openings in the one or more dielectric layers 103 of the first interconnect layer 107. In an embodiment the openings may be formed by placing and patterning a photoresist material over the topmost dielectric layer of the first interconnect layer 107. Once the photoresist material has been placed and patterned, a dry etch process such as a reactive ion etch may be utilized to transfer the pattern from the photoresist into the underlying dielectric layers 103 to form the openings to a first depth D1 in the first interconnect layer 107. According to some embodiments, the first depth D1 of between about 20 nm and about 150 nm, such as about 25 nm. However, any suitable depths may be utilized. Once the openings have been formed, the photoresist material may be removed, for example, by ashing and/or etching processes.

Once the photoresist has been removed, the openings may be filled or overfilled with a conductive structure in order to form conductive structures of the first test pad 105. In an embodiment, the conductive structures of the first test pad 105 may be formed by depositing a barrier layer 113 over the first interconnect layer 107, the barrier layer 113 conforming to bottoms and sidewalls of the openings and to an upper surface of the first interconnect layer 107. In some embodiments, the barrier layer 113 may be a barrier material such as titanium nitride or tantalum nitride which may be deposited using a deposition process such as chemical vapor deposition, physical vapor deposition, atomic layer deposition, or the like. However, any suitable material or method of deposition may be utilized to form the barrier layer. In some embodiments, the barrier layer may be formed to a thickness of between about 20 Å and about 100 Å, such as about 30 Å. However, any suitable materials and thicknesses may be used.

Once the barrier layer 113 has been formed, a conductive material 115 may be deposited to fill and/or overfill the openings within the first interconnect layer 107. In an embodiment the conductive material 115 may be a material such as copper, tungsten, ruthenium, titanium dioxide, combinations of these, or the like, formed, e.g., using a seed layer (not shown) and a plating process, such as electrochemical plating, although other processes of formation, such as sputtering, evaporation, atomic layer deposition, or a PECVD process, may also be used depending upon the desired materials. Once the openings have been filled or overfilled with the conductive material 115, any excess materials outside of the openings may be removed, for example, via chemical mechanical planarization (CMP) to planarize the first test pad 105 with the first interconnect layer 107.

The first interconnect layer 107 further comprises one or more conductive features (not shown) such as metal lines, conductive vias (e.g., connections), contact plugs, or conductive trenches, redistribution lines, conductive pads, or the like, which are formed in the dielectric layers 103 to electrically couple the device elements 108 with overlying structures, with each other, and also with the first test pad 105. In an embodiment the one or more conductive features within the first interconnect layer 107 may be formed simultaneously with and using the same processes as the first test pad 105. However, if desired, the one or more conductive features may be formed using different materials, different processes, and at different times as the first test pad 105.

Figure 1B:
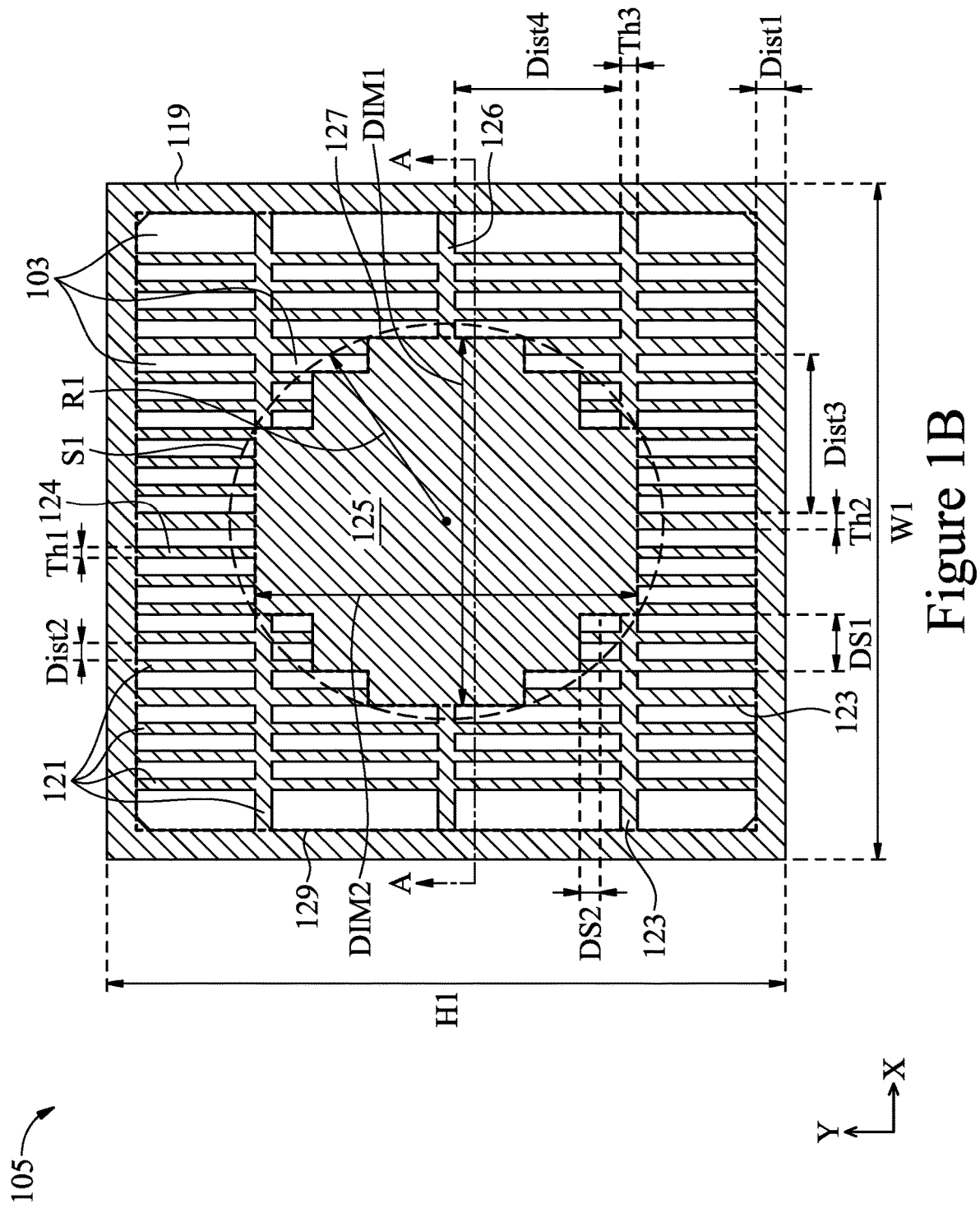
FIG. 1B illustrates a plan view of the test pad of FIG. 1A, in accordance with some embodiments.

FIG. 1B illustrates a plan view of the first test pad 105, wherein line A-A in FIG. 1B illustrates the cut line of the first test pad 105 which can be seen in FIG. 1A. In accordance with some embodiments, the first test pad 105 comprises a frame 119, grid features 121, a first panel region 125, wherein the frame 119 is formed at an outer perimeter of the first test pad 105, the first panel region 125 is located within the frame 119 and the grid features 121 extend from a point along the frame 119 to another point along the frame 119 with at least some of the grid features 121 intersecting the first panel region 125. FIG. 1B further illustrates that areas between the frame 119, the grid features 121 and the first panel region 125 are separated by portions of the dielectric layers 103 of the first interconnect layer 107. As such, the first test pad 105 may also be referred to herein as a "spider pad."

In some embodiments, the frame 119 is rectangular-shaped and has an inner perimeter and an outer perimeter, although the frame 119 may have any suitable regular shape or any suitable irregular shape. The shape of the frame 119 may comprise any suitable contours including curved edges, convex edges, concave edges, straight edges, angled edges, combinations of these, and the like. Examples of shapes of the frame 119 include, but are not limited to, circles, ovals, triangles, rectangles, squares, rhombuses, trapezoids, and the like. Furthermore, the frame 119 may have any suitable orientation. According to some embodiments, the frame 119 has a first height H1 of between about 20 µm and about 80 µm, such as about 30 µm, a first width W1 of between about 20 µm and about 80 µm, such as about 30 µm. As such, the frame 119 and hence, the first test pad 105, has a first area A1 (e.g., A1=H1×W1) of between about 400 µm² and about 6400 µm², such as about 900 µm². In some embodiments, the inner perimeter of the frame 119 may be separated from the outer perimeter by a first distance Dist1 of between about 0.5 µm and about 5 µm, such as about 2.5 µm. However, any suitable height, width, area and distance may be used.

According to some embodiments, the grid features 121 may have the same shape or may have different shapes, may have a same orientation or different orientations, and may be arranged at a same angle or at different angles. According to some embodiments, the grid features 121 may have the same thickness or may have different thicknesses, and may be arranged at a same pitch or at different pitches. In some embodiments, the grid features 121 comprise a first series 124 of straight lines that are parallel to one another, have a first orientation (e.g., y-direction), have a same first thickness Th1 of between about 0.1 µm and about 4 µm, such as about 0.5 µm. However, any suitable shapes, orientations, angles, thicknesses and pitches may be used for the first series 124 of straight lines.

Providing grid features 121 with the first thicknesses Th1 in this range ensures the integrity of the first series 124 of straight lines. For example, providing the grid features 121 with first thicknesses Th1 being at least 0.1 µm prevents the grid features 121 from being broken due to photolithographic exposure limitations during patterning and deposition processing. Providing the grid features 121 with first thicknesses Th1 being no greater than 4 µm reduces or even prevents dishing and avoids over polishing of the first series 124 of straight lines during chemical mechanical planarization processing.

Additionally, the first series 124 of straight lines may be arranged at a second distance Dist2 from one another of between about 0.1 µm and about 4 µm, such as about 1 µm. Arranging the first series 124 of straight lines at the second distance Dist2 allows for a pattern density ratio (Th1/(Th1+Dist2)) which reduces or eliminates dishing of the grid features 121 during chemical mechanical planarization. For example, with the second distance Dist2 being less than less than 0.1 µm increases the pattern density ratio which can lead to increased dishing during chemical mechanical planarization. Arranging the first series 124 of straight lines at the second distance Dist2 greater than 4 µm increases the pad resistance of the first pad 105 which may impact the results of wafer acceptance testing measurements.

In some embodiments, the grid features 121 further comprise a second series 123 of straight lines that are parallel to one another and have the first orientation (e.g., y-direction). In this embodiment the second series 123 of straight lines may have a second thickness Th2 that is greater than the first thickness Th1 (of the first series of straight lines), such as being between about 0.5 µm and about 4.0 µm, such as about 1 µm. Further, the second series 123 of straight lines may be arranged at a third distance Dist3 from one another of between about 1 µm and about 10 µm, such as about 8.5 µm. However, any suitable shapes, orientations, angles, thicknesses and pitches may be used for the second series 123 of straight lines.

In some embodiments, the grid features 121 comprise a third series 126 of straight lines that are perpendicular to the orientation of the first series 124 of straight lines. In this embodiment the third series 126 of straight lines have a third thickness Th3 that is greater than the first thickness Th1 and may be between about 0.5 µm and about 4 µm, such as about 1 µm and may are arranged at a fourth distance Dist4 from one another of between about 1 µm and about 10 µm, such as about 8.5 µm. However, any suitable shapes, orientations, angles, thicknesses and pitches may be used for the third series 126 of straight lines.

Providing grid features 121 with the third thicknesses Th3 in this range ensures the integrity of the grid features 121. For example, providing the grid features 121 with third thicknesses Th3 being at least 0.5 µm prevents the grid features 121 from being broken due to photolithographic exposure limitations during patterning and deposition processing. Providing the grid features 121 with third thicknesses Th3 being no greater than 4 µm reduces or even prevents dishing and avoids over polishing of the grid features 121 during chemical mechanical planarization. Arranging the third series 126 of straight lines at the fourth distance Dist4 allows for a pattern density ratio (Th3/(Th3+Dist4)) which reduces or eliminates dishing of the third series 126 of straight lines during chemical mechanical planarization. For example, with the fourth distance Dist4 being less than less than 1 µm increases the pattern density ratio which can lead to increased dishing during chemical mechanical planarization. Arranging the third series 126 of straight lines at the fourth distance Dist4 greater than 10 µm increases the pad resistance which may impact the results of wafer acceptance testing measurements.

FIG. 1B further illustrates that the first panel region 125 is a solid region having a first shape S1 (e.g., circular, elliptical, oval or the like) with serrated edges. The first panel region 125 may be located within a central region of the first test pad 105 and is sized and shaped to provide sufficient contact area for receiving a wafer test probe. However, the first panel region 125 (e.g., probe region) may also be located at other locations within the frame 119 and may even be integrally formed with one or more portions of the frame 119. In some embodiments, a grid feature of the second series of grid features 121 intersects a centerline of the first panel region 125 having the first orientation (e.g., y-direction) and other grid features of the second series of grid features 121 intersect an outer edge portion of the first panel region 125. In some embodiments, a grid feature of the third series 126 of grid features 121 intersects a centerline of the first panel region 125 having the second orientation (e.g., x-direction) and other grid features of the third series 126 of grid features 121 intersect an outer edge portion of the first panel region 125.

FIG. 1B further illustrates that the first panel region 125 may have a major axis (e.g., first dimension DIM1) and a minor axis (e.g., second dimension DIM2). According to some embodiments, the first dimension DIM1 is between about 10 µm and about 30 µm, such as about 20 µm and the second dimension DIM2 is between about 10 µm and about 30 µm, such as about 20 µm. Additionally, the first panel region 125 has a second area A2 that is highlighted with a first thick dashed line 127 and the second area A2 may be between about 78 µm² and about 707 µm², such as about 314 µm². However, any suitable dimensions, radius, and/or areas may be utilized.

Additionally, in some embodiments the furthest most edges of the first panel region 125 may fall along a circle S1 with a first radius R1 of between about 5 µm and about 15 µm, such as about 10 µm, while serrated edges extend inwards from the circle S1. In such an embodiment the serrated edges may extend inwards in a first direction a first serrated distance DS1 of between about 0.5 µm and about 4 µm, such as about 3 µm, and may extend inwards in a second direction a second serrated distance DS2 of between about 0.5 µm and about 4 µm, such as about 3 µm. However, any suitable dimensions may be utilized.

FIG. 1B further illustrates that the first test pad 105 has a third area A3 within the region occupied by the grid features 121 between the perimeter of the first panel region 125 and the inner perimeter of the frame 119 highlighted by the second thick dashed line 129. According to some embodiments, the third area A3 is between about 100 µm² and about 6241 µm², such as about 625 µm². However, any suitable area may be used. In some embodiments, a first ratio of the area of the first panel region 125 to the area of the first test pad 105 (Ratio1=A2/A1) may be between about 1:1.3 and about 1:82, such as about 1:2.9 and a second ratio of the area occupied by the grid features 121 to the area of the first test pad 105 (Ratio2=A3/A1) may be between about 1:1 and about 1:4, such as about 1:1.44. However, any suitable areas and ratios may be used.

Once formed, the first test pad 105 may be used for in situ testing of one or more of the device elements 108 during manufacturing of the semiconductor wafer 100. For example, the first test pad 105 may be used to facilitate wafer acceptance testing (WAT) and/or circuit probe (CP) testing for process control monitoring (PCM). The WAT may be performed to analyze the success of the wafer fabrication process at various stages of fabrication and attempt to determine the cause of any fabrication deficiencies. The CP (circuit probe) test involves using one or more probes to determine which die are good and which are not. The probing may be performed by contacting a probe needle (not shown) to the first test pad 105. The probe needle may be a part of a probe card having a plurality of probe needles, for example, which is connected to testing equipment (not shown). During testing (e.g., WAT and/or PCM) the probe needle is placed in contact with the first test pad 105 to make an electrical contact, so voltage or current can be applied to test for device functionality and performance at the present intermediate stage of forming the semiconductor wafer 100. If the semiconductor wafer 100 passes the wafer-acceptance-test, the die is a known good die (KGD).

Figure 2:
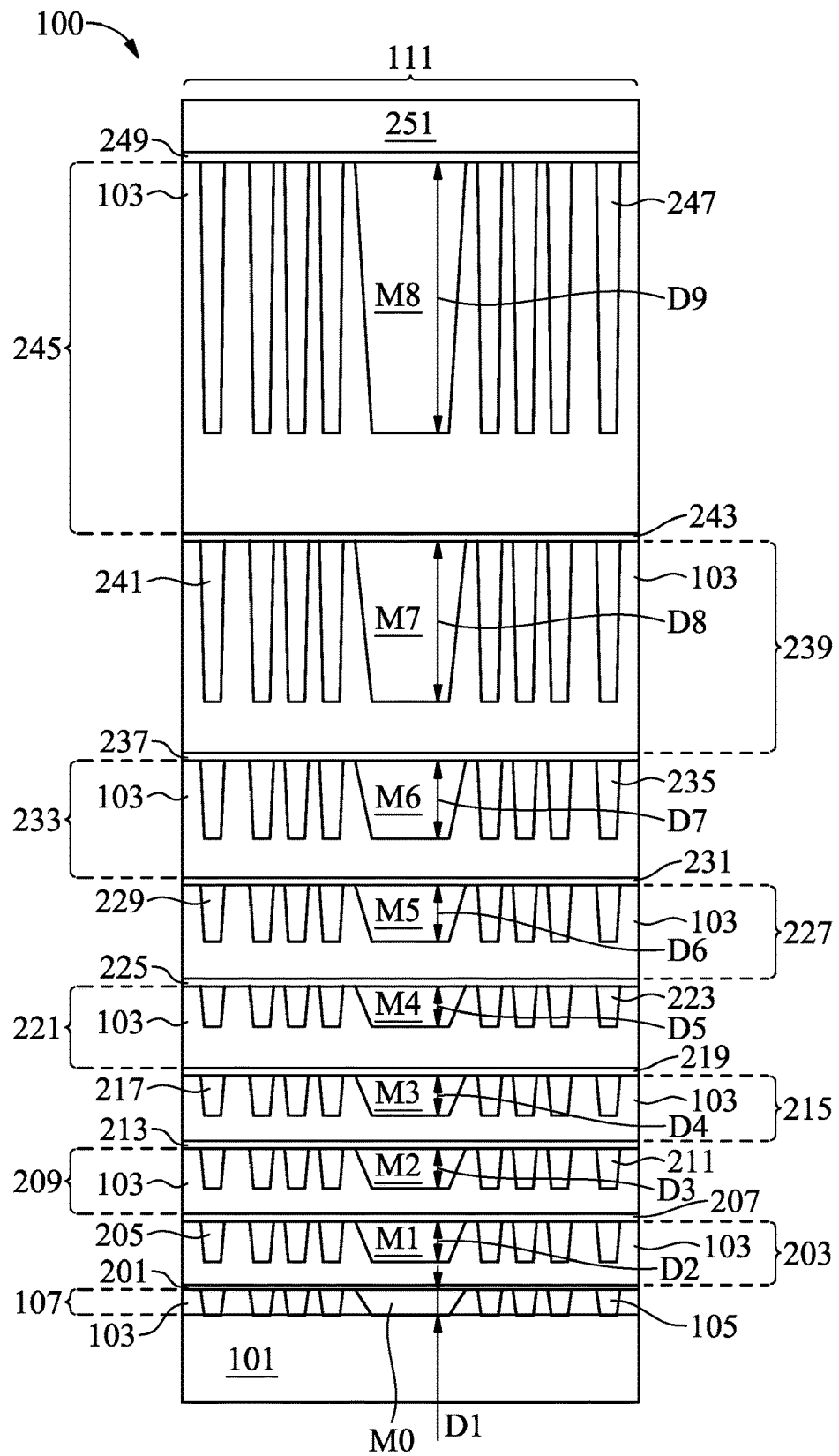
FIG. 2 illustrates a cross-sectional view of forming the test pads within different metallization layers of the semiconductor wafer at intermediate steps of manufacturing the semiconductor dies.

FIG. 2 illustrates a cross-sectional view of the semiconductor wafer 100 in an intermediate step of manufacturing the semiconductor dies. In particular, FIG. 2 illustrates forming further interconnect layers (with only the scribe line region 111 being shown for clarity) over the first interconnect layer 107 of the semiconductor wafer 100, in accordance with some embodiments. In particular, FIG. 2 illustrates the formation of test pads (e.g., a second test pad 205, a third test pad 211, a fourth test pad 217, a fifth test pad 223, a sixth test pad 229, a seventh test pad 235, an eighth test pad 241, and a ninth test pad 247) in metallization layers (e.g., a first metallization layer M1, a second metallization layer M2, a third metallization layer M3, a fourth metallization layer M4, a fifth metallization layer M5, a sixth metallization layer M6, a seventh metallization layer M7, and an eighth metallization layer M8) formed over the bottom metallization layer M0. Although nine test pads (e.g., the first test pad 105, the second test pad 205, the third test pad 211, the fourth test pad 217, the fifth test pad 223, the sixth test pad 229, the seventh test pad 235, the eighth test pad 241, and the ninth test pad 247) and nine interconnect layers (e.g., the first interconnect layer 107, the second interconnect layer 203, the third interconnect layer 209, the fourth interconnect layer 215, the fifth interconnect layer 221, the sixth interconnect layer 227, the seventh interconnect layer 233, the eighth interconnect layer 239, and the ninth interconnect layer 245) are illustrated in FIG. 2, any suitable number of the test pads and suitable number of the interconnect layers (e.g., metallization layers) may be utilized.

Once the first interconnect layer 107 has been formed at the bottom metallization layer M0 and any desired WAT and PCM tests have been performed on the device elements at the bottom metallization layer M0, a etch stop layer 201 can be formed over the first interconnect layer 107 to isolate the first test pad 105 in the bottom metallization layer M0 from overlying structures. The etch stop layer 201 is used to protect the first interconnect layer 107 and to provide a control point for a subsequent etching process, for example, in the subsequently formed metallization layer.

According to some embodiments, the etch stop layer 201 may be formed using materials such as silicon nitride (SiN), nitrides, carbides, borides, carbon doped oxides (e.g., SiOC), or aluminum oxides, combinations thereof, or the like. The etch stop layer 201 may be formed using a plasma enhanced chemical vapor deposition (PECVD), low pressure CVD (LPCVD), PVD, CVD, ALD, combinations of these, or the like, although any suitable deposition techniques may be used.

Once the etch stop layer 201 has been formed over the first interconnect layer 107, a second interconnect layer 203 may be formed over the etch stop layer 201. According to some embodiments, the second interconnect layer 203 comprises one or more dielectric layers 103, a plurality of conductive features (not shown) and a second test pad 205. The plurality of conductive features of the second interconnect layer 203 may be formed to electrically couple the plurality of conductive features of the first interconnect layer 107 and hence, one or more of the device elements 108 (shown in FIG. 1A), to overlying structures. Furthermore, at least one of the plurality of conductive features formed in the second interconnect layer 203 electrically couples the second test pad 205 to one or more of the device elements 108 through the first interconnect layer 107 to the second interconnect layer 203. The one or more dielectric layers 103, the plurality of conductive features, and the second test pad 205 may be formed using any of the materials and processes suitable for forming the one or more dielectric layers 103, the plurality of conductive features, and the first test pad 105 in the first interconnect layer 107, as set forth above. However, other suitable materials, processes, and depths may be used.

According to some embodiments, the second test pad 205 is formed to a second depth D2 larger than the first depth D1 and may be between about 20 nm and about 850 nm, such as about 40 nm. Once the second test pad 205 has been formed, any desired WAT and PCM tests can be performed on the one or more of the device elements 108 of the bottom metallization layer M0.

Once the desired tests have been performed using the second test pad 205, a second etch stop layer 207 can be formed over the second interconnect layer 203 to isolate the conductive features, and the second test pad 205 from overlying structures. In an embodiment the second etch stop layer 207 may be formed using materials and processes as described above with respect to the first etch stop layer 201. However, any suitable material and process may be utilized.

Once the second etch stop layer 207 has been formed over the second interconnect layer 203, a third interconnect layer 209 comprising one or more dielectric layers 103, a plurality of conductive features (not shown), and a third test pad 211 may be formed over the second etch stop layer 207 as the second metallization layer M2. In an embodiment the third interconnect layer 209 may be formed using processes and materials similar to the formation of the second interconnect layer 203, although the third test pad 211 may be formed to a third depth D3 of between about 20 nm and about 850 nm, such as about 36 nm. However, any suitable methods, materials, and depths may be utilized.

One or more of the plurality of conductive features of the third interconnect layer 209 electrically couple the third test pad 211 and/or overlying structures to one or more of the plurality of conductive features of the second interconnect layer 203. As such, one or more of the device elements 108 (shown in FIG. 1A) of the first interconnect layer 107 are electrically coupled to the third test pad 211. Once the third test pad 211 has been formed, any desired WAT and PCM tests may be performed on the one or more of the device elements 108 of the bottom metallization layer M0.

Following testing using the third test pad 211 of the third interconnect layer 209, the process may continue by repeatedly depositing further etch stop layers (e.g., the third etch stop layer 213, the fourth etch stop layer 219, the fifth etch stop layer 225, the sixth etch stop layer 231, the seventh etch stop layer 237, the eighth etch stop layer 243, and the ninth etch stop layer 249), forming further interconnect layers (e.g., the fourth interconnect layer 215, the fifth interconnect layer 221, the sixth interconnect layer 227, the seventh interconnect layer 233, the eighth interconnect layer 239, the ninth interconnect layer 245) comprising further test pads (e.g., the fourth test pad 217, the fifth test pad 223, the sixth test pad 229, the seventh test pad 235, the eighth test pad 241, and the ninth test pad 247), further conductive features (not shown) as metallization layers (e.g., the third metallization layer M3, the fourth metallization layer M4, the fifth metallization layer M5, the sixth metallization layer M6, the seventh metallization layer M7, and the eighth metallization layer M8) until a desired topmost metallization layer (e.g., the eighth metallization layer M8) has been formed. After forming each interconnect layer, further desired tests may be performed using the test pads formed within the respective metallization layers to access the underlying metallization layers, respectively.

According to some embodiments, the test pads (e.g., the first test pad 105, the second test pad 205, the third test pad 211, the fourth test pad 217, the fifth test pad 223, the sixth test pad 229, the seventh test pad 235, the eighth test pad 241, and the ninth test pad 247) of the metallization layers may be formed to a same depth (e.g., the first depth D1) or they may be formed to different depths (e.g., first depth D1, second depth D2, third depth D3, fourth depth D4, fifth depth D5, sixth depth D6, seventh depth D7, eighth depth D8, and ninth depth D9). According to some embodiments, the first depth D1 of the bottom metallization layer M0 may be between about 20 nm and about 150 nm, such as about 25 nm. The second depth D2 of the first metallization layer M1 may be between about 20 nm and about 850 nm, such as about 40 nm. The third depth D3 of the second metallization layer M2 may be between about 20 nm and about 850 nm, such as about 36 nm. The fourth depth D4 of the third metallization layer M3 may be between about 20 nm and about 850 nm, such as about 46 nm. The fifth depth D5 of the fourth metallization layer M4 may be between about 20 nm and about 850 nm, such as about 56 nm. The sixth depth D6 of the fifth metallization layer M5 may be between about 20 nm and about 850 nm, such as about 76 nm. The seventh depth D7 of the sixth metallization layer M6 may be between about 20 nm and about 850 nm, such as about 76 nm. The eighth depth D8 of the seventh metallization layer M7 may be between about 20 nm and about 850 nm, such as about 150 nm. The ninth depth D9 of the eighth metallization layer M8 may be between about 20 nm and about 850 nm, such as about 850 nm. However, any suitable depths may be utilized.

Furthermore, the test pads of the metallization layers may have the same shapes, dimensions (e.g., first height H1, first width W1, first distance Dist1, first thickness Th1, second thickness Th2, third thickness Th3, first pitch P1, second pitch P2, third pitch P3, first dimension DIM1 and second dimension DIM2) and areas, or they may have different shapes, dimensions and areas. According to some embodiments, the test pads of the bottom metallization layer M0 to the eighth metallization layer M8 may have the same first ratios Ratio1 and the same second ratios Ratio2 or they may have different ratios.

FIG. 2 further illustrates a passivation layer 251 formed over a topmost interconnect layer (e.g., eighth metallization layer M8). According to some embodiments, the passivation layer 251 may be polybenzoxazole (PBO), although any suitable material, such as benzocyclobutene (BCB), polyimide, or a polyimide derivative, may also be utilized. The passivation layer 251 may be placed using, e.g., a spin-coating process, although any suitable method may also be used. Once the passivation layer 251 has been formed, further layers (e.g., redistribution layers, further conductive features, connectors, and the like) may be formed over and/or through the passivation layer 251 to electrically couple overlying conductive features and/or semiconductor devices to the device elements formed in the device region 109 of the semiconductor wafer 100. For example, the passivation layer 251 may be patterned using photolithography techniques to form openings through which conductive features of the topmost interconnect layer (e.g., eighth metallization layer M8) are exposed. Once exposed, the further conductive features may be formed in the openings using conductive materials such as aluminum, aluminum alloy, copper, or copper alloy, although other metallic materials may be used. Furthermore, once the passivation layer 251 has been formed and any overlying conductive features and/or any overlying semiconductor devices have been electrically coupled to the device elements, the semiconductor wafer 100 may undergo further packaging processes to package the semiconductor dies formed within the semiconductor wafer 100.

Figure 3:
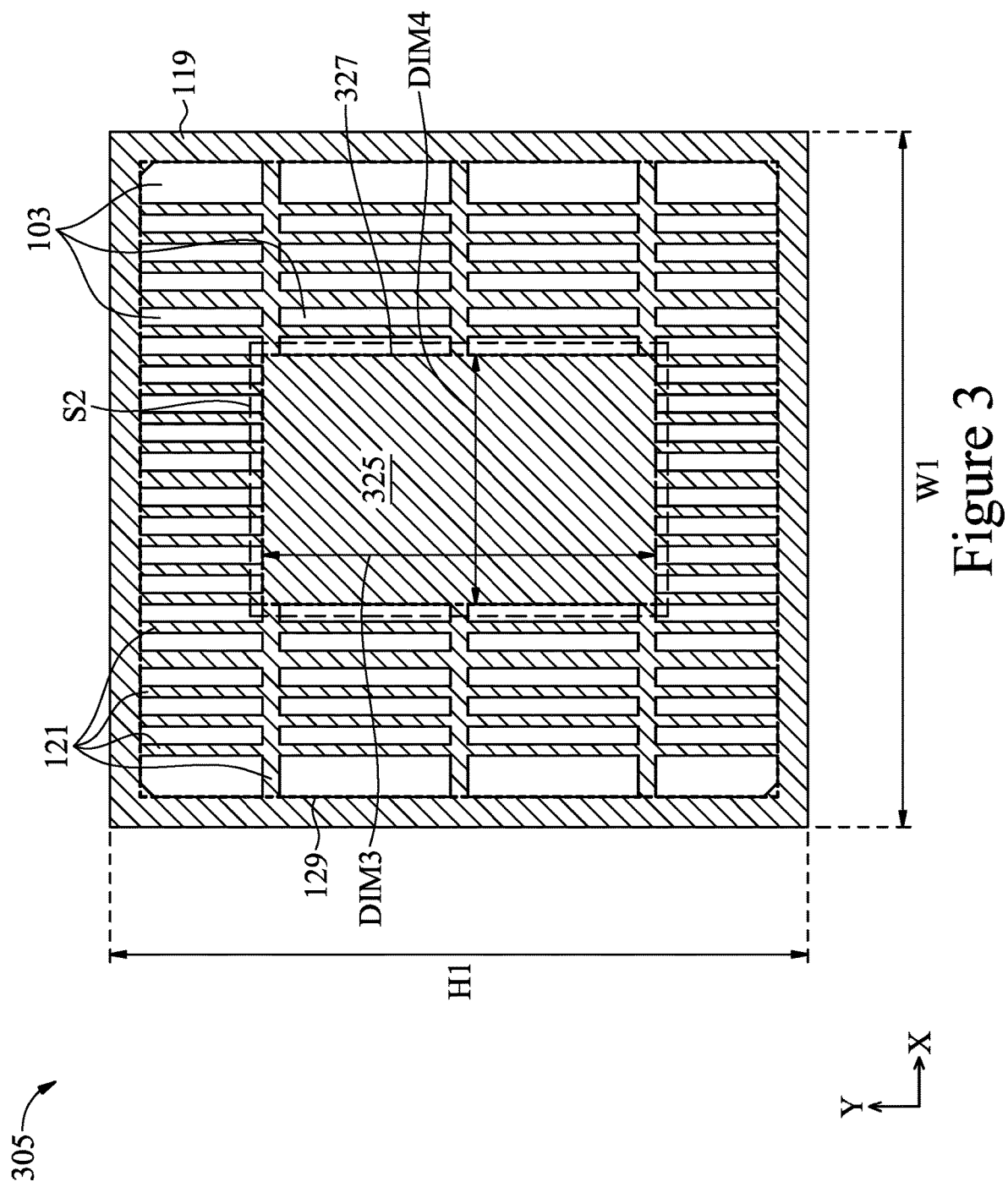
FIG. 3 illustrates a plan view of another test pad, according to an embodiment.

FIG. 3 illustrates a plan view of a second test pad 305 having a second panel region 325, according to another embodiment. The second test pad 305 is similar to the first test pad 105 with the difference being the shape of the second panel region 325 is different from the first panel region 125. The second panel region 325 is a solid region having a second shape S2 (e.g., rectangular, square, or the like) with straight edges. Although the second panel region 325 illustrated in FIG. 3 has a rectangular-shaped perimeter, the second panel region 325 may have any suitable shape. The second panel region 325 may have any suitable regular shape or any suitable irregular shape including any of the examples set forth above for the shape of the frame 119.

Furthermore, the second test pad 305 may have a same first width W1, first height H1, and first area (A1=W1×H1) as the first test pad 105, although the widths, heights, and areas of the first test pad 105 and the second test pad 305 may be different from one another. Also, the frame 119 of the second test pad 305 may have a same size inner perimeter as the frame 119 of the first test pad 105, although they may also be different. The inner perimeter of the frame 119 is highlighted in FIG. 3 by the second thick dashed line 129. The second panel region 325 may have a major axis with a third dimension DIM3 of between about 15 μm and about 30 μm, such as about 15 μm and a minor axis with a fourth dimension DIM4 of between about 12 μm and about 18 μm, such as about 12 μm. As such, the second panel region 325 has a fourth area (A4=DIM3×DIM4) within the perimeter of the second panel region 325 highlighted with a third thick dashed line 327 and a fifth area A5 in the region occupied by the grid features 121 between the perimeter of the second panel region 325 and the inner perimeter of the frame 119 highlighted by the second thick dashed line 129. According to some embodiments, the fourth area A4 may be between about 180 μm$^2$ and about 540 μm$^2$, such as about 180 μm$^2$ and the fifth area A5 may be between about 100 μm$^2$ and about 6241 μm$^2$, such as about 625 μm$^2$. Furthermore, a third ratio of the area of the second panel region 325 to the area of the frame 119 (Ratio3=A4/A1) may be between about 1:1.1 and about 1:35, such as about 1:3 and a fourth ratio of the area occupied by the grid features 121 to the area of the frame 119 (Ratio4=A5/A1) may be between about 1:1 and about 1:4, such as about 1:1.44. However, any suitable areas and ratios may be used.

By utilizing the spider pad designs described herein, damage that can occur to the test pads or that originate from damage caused to the test pads can be reduced or eliminated. For example, during fabrication of a semiconductor wafer, the chemical mechanical planarization (CMP) processes used to remove excess materials deposited may also cause solid conductive features to suffer from dishing (e.g., over-polishing) such that an upper surface of the solid conductive features are reduced below the planar surface of the dielectric layer. As such, during testing a probe may fail to make sufficient contact with a test pad that has significant dishing issues and, hence, prevents the desired test from being performed.

However, by utilizing the grid features 121 along with the first panel region 125, such dishing may be minimized. In particular, by spacing the grid features 121 within the dielectric of the one or more dielectric layers 103, the density of material throughout first test pad 105 may be more equal, resulting in less dishing.

Furthermore, during testing (e.g., WAT and/or PCM) a probe is used to make an electrical contact between a probe pin and the test pads, so voltage or current can be applied to test for device functionality and performance, and these probes can damage the test pads. Such damage, when coupled with the large mechanical stresses caused by the singulation process, may propagate to the device region. Propagation of such damage may be especially true for dielectric layers comprising low-k dielectric materials.

Figure 4:
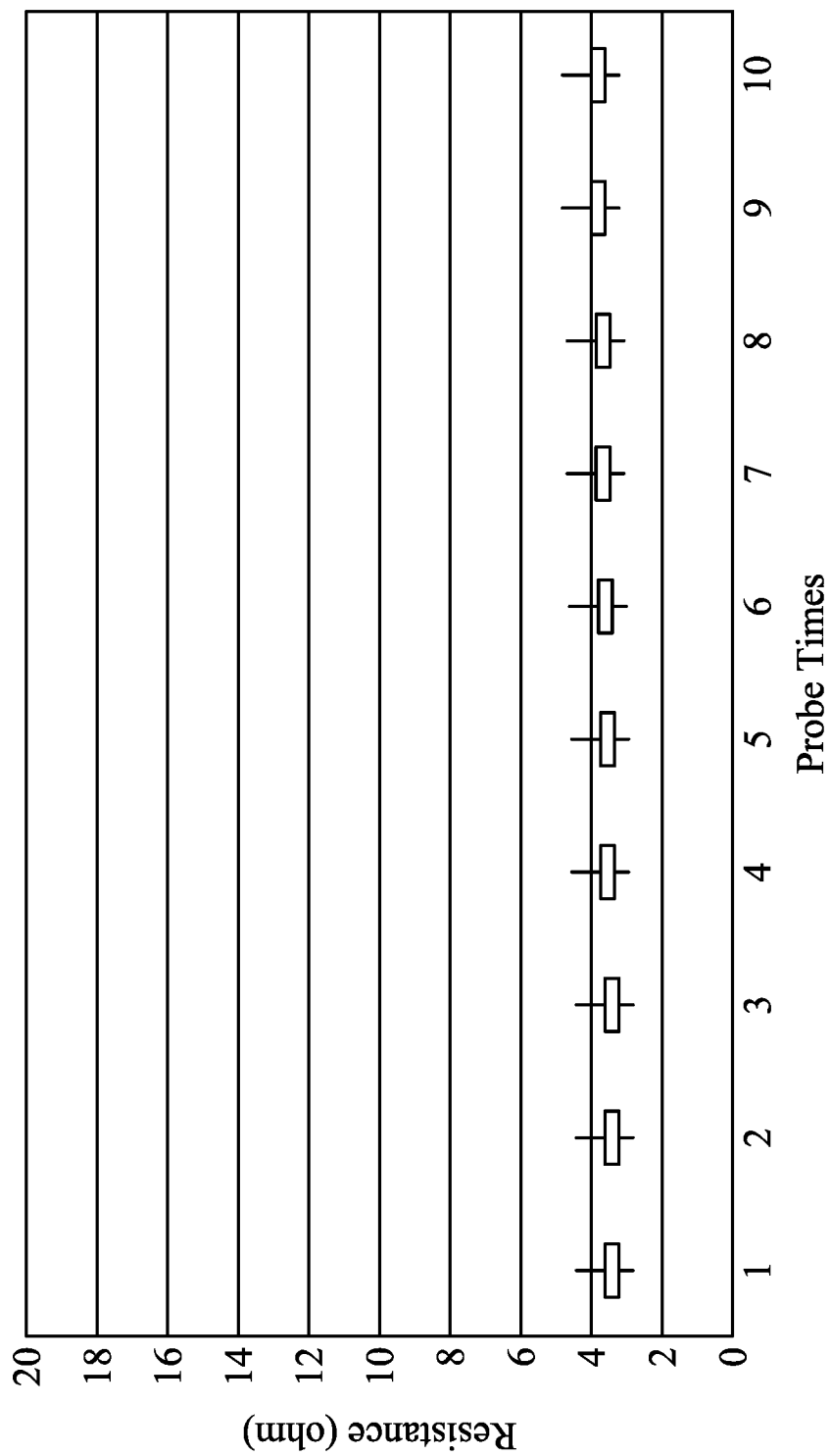
FIG. 4 illustrates test data, in accordance with some embodiments.

However, by utilizing the spider pad designs as described herein, the damage caused by dishing and probing can be minimized. For example, FIG. 4 is a table showing resistances of the first test pad 105 (e.g., spider pad) undergoing wafer acceptance testing (WATs) and/or PCM during the first ten probe tests of a duty cycle for the first test pad 105. During a first probe test the spider pad has a resistance of less than about 4 ohms. Furthermore, little to no damage to the spider pad is caused by the test probe, even after ten probe tests. As can be seen in FIG. 4, the resistance of the spider pad remains at or below 4 ohms throughout the ten probe tests.

A horizontal grid pad (not shown) formed to the same dimensions of the spider pad, however, with only one series of grid features 121 that are parallel to one another and span from one side of the frame 119 to another side of the frame 119 without an intervening panel region (e.g., first panel region 125) formed there between, will have a higher resistance than that of the spider pad. For example, during a first probe test the horizontal grid pad has a resistance of more than about 6 ohms. Furthermore, damage to the horizontal grid pad caused by the test probe after the probe test (e.g., ten probe tests) increases the resistance of the horizontal grid to more than 8 ohms. Significant damage to the horizontal test pad may result in inaccurate and/or altogether failed probe tests (e.g., WAT and/or PCM).

According to the embodiments disclosed herein, the dielectric material between grid features of the test pads helps to prevent dishing of the test pads such that sufficient contact between the test probe and the test pad can be made during testing. Furthermore, the panel regions of the test pads allow for robust contact areas for the probe during the repeated testing such that any slipping of the probe is prevented from causing damage to grid portions of the test pad. As such, the test pads according to the embodiments disclosed herein can be produced with fewer defects due to dishing and can maintain their physical integrity and electrical resistances over repeated testing as compared to test pads having only solid pad regions or test pads having only grid features.

In an embodiment, a method includes: depositing a dielectric layer over a substrate; etching openings in the dielectric layer; and depositing a conductive material in the openings to form a first grid feature and a panel region of a test pad, the first grid feature extending lengthwise from the panel region to a perimeter of the test pad, the first grid feature having a first width at the panel region being less than a width of the panel region at the first grid feature. In an embodiment the method further includes performing a probe test using the test pad. In an embodiment the depositing the conductive material in the openings further includes forming a second grid feature of the test pad, the second grid feature extending lengthwise from the panel region to the perimeter of the test pad, a first portion of the dielectric layer being disposed between the first grid feature and the second grid feature. In an embodiment the second grid feature has a second width, the second width being greater than the first width. In an embodiment the panel region has a serrated edge. In an embodiment the depositing the conductive material in the openings further includes forming a third grid feature of the test pad, the third grid feature extending from the panel region to the perimeter of the test pad, the third grid feature being perpendicular to the first grid feature. In an embodiment the panel region is a rectangle.

In another embodiment, a method includes: etching openings in a dielectric layer over a substrate; depositing a conductive material in the openings; and planarizing the conductive material with the dielectric layer to form a test pad comprising a frame, a grid region within the frame, and a probe region within an interior of the grid region, the grid region comprising conductive grid features separated by portions of the dielectric layer. In an embodiment the planarizing the conductive material with the dielectric layer comprises forming the conductive grid features intersecting both the frame and the probe region. In an embodiment the forming the conductive grid features comprises forming a first grid feature in a first orientation and forming a second grid feature in a second orientation perpendicular to the first orientation. In an embodiment the forming the first grid feature comprises forming the first grid feature to a first thickness; and the forming the second grid feature comprises forming the second grid feature to a second thickness greater than the first thickness. In an embodiment the forming at least some of the conductive grid features intersecting the frame and the probe region comprises forming a third grid feature in the first orientation and to the second thickness. In an embodiment the method further includes: depositing a second dielectric layer over the test pad; and forming a second test pad in the second dielectric layer. In an embodiment the second test pad extends further into the second dielectric layer than the test pad extends into the dielectric layer.

In yet another embodiment, a semiconductor device includes: a first pad over a substrate, the first pad including: an outer frame, the outer frame including a conductive material; a panel region surrounded by the outer frame, the panel region being a continuous electrically conductive region; and a conductive grid between the outer frame and the panel region; and a plurality of dielectric regions, wherein each dielectric region of the plurality of dielectric regions is surrounded by conductive material of the conductive grid, the panel region, or the outer frame, and wherein a first dielectric region of the plurality of dielectric regions has a first length and a first width in a top view, the first length being greater than the first width. In an embodiment the outer frame has a rectangular shape in the top view. In an embodiment the conductive grid electrically couples the outer frame with the panel region. In an embodiment the panel region has a serrated edge in the top view. In an embodiment the panel region has a rectangular edge in the top view. In an embodiment the semiconductor device further includes an active device over the substrate, wherein a bottom surface of the panel region extends below a top surface of the active device. In an embodiment the semiconductor device further includes a second pad over the first pad, wherein the first pad has a first depth, the second pad has a second depth, and the second depth is greater than the first depth. In an embodiment the first depth is in a range of 20 nm to 850 nm.

In yet another embodiment, a semiconductor device includes: a pad within a dielectric material, the pad including: a panel region, the panel region having a continuous conductive top surface; and a grid region surrounding the panel region in a top view, the grid region including conductive grid members, wherein a first one of the conductive grid members has a first thickness and the panel region has a second thickness, the first thickness being less than the second thickness, and wherein a first dielectric region is between the first one of the conductive grid members and a second one of the conductive grid members, wherein the first dielectric region has a first width and a first length in a top view, the first width being less than the first length. In an embodiment a second dielectric region is between a third one of the conductive grid members and a fourth one of the conductive grid members, the second dielectric region having the first width and a second length, the second length being less than the first length. In an embodiment a third dielectric region is between a fifth one of the conductive grid members and a sixth one of the conductive grid members, the third dielectric region having the first length and a second width, the second width being greater than the first width. In an embodiment the panel region has a first dimension in a range of 10 µm to 30 µm and a second dimension in a range of 10 µm to 30 µm. In an embodiment the pad has an area in a range of 400 µm$^2$ to 6400 µm$^2$. In an embodiment the panel region has an area in a range of 78 µm$^2$ to 707 µm$^2$.

In yet another embodiment, a semiconductor device includes: a dielectric material covering an active device; a first test pad within the dielectric material, the first test pad including: an outer frame; a grid region extending inwards from the outer frame, the grid region including conductive grid members that are separated from one another by the dielectric material; and a panel region within an interior of the grid region in a top view, a bottom surface of the panel region extending below a top surface of the active device in a cross-sectional view, wherein a first one of the conductive grid members connects the panel region to the outer frame, and wherein the first one of the conductive grid members has a first thickness and the panel region has a second thickness, the first thickness being less than the second thickness in the top view. In an embodiment a second one of the conductive grid members has a third thickness, the third thickness being greater than the first thickness. In an embodiment the dielectric material is between the panel region and the outer frame, a portion of the dielectric material being disposed between the first one of the conductive grid members and the second one of the conductive grid members. In an embodiment the first one of the conductive grid members and the second one of the conductive grid members are each aligned in a first direction. In an embodiment the semiconductor device further includes a second test pad overlying the first test pad, the second test pad including a second outer frame, a second grid region, and a second panel region. In an embodiment the semiconductor device further includes a third one of the conductive grid members, wherein the third one of the conductive grid members is perpendicular to the first one of the conductive grid members in the top view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first pad over a substrate, the first pad comprising:
   an outer frame, the outer frame comprising a conductive material;
   a panel region surrounded by the outer frame, the panel region being a continuous electrically conductive region; and
   a conductive grid between the outer frame and the panel region;

an active device over the substrate, wherein a bottom surface of the panel region extends below a top surface of the active device; and a plurality of dielectric regions, wherein each dielectric region of the plurality of dielectric regions is surrounded by conductive material of the conductive grid, the panel region, or the outer frame, and wherein a first dielectric region of the plurality of dielectric regions has a first length and a first width in a top view, the first length being greater than the first width.

2. The semiconductor device of claim 1, wherein the outer frame has a rectangular shape in the top view.

3. The semiconductor device of claim 1, wherein the conductive grid electrically couples the outer frame with the panel region.

4. The semiconductor device of claim 1, wherein the panel region has a serrated edge in the top view.

5. The semiconductor device of claim 1, wherein the panel region has a rectangular edge in the top view.

6. The semiconductor device of claim 1, further comprising a second pad over the first pad, wherein the first pad has a first depth, the second pad has a second depth, and the second depth is greater than the first depth.

7. The semiconductor device of claim 6, wherein the first depth is in a range of 20 nm to 850 nm.

8. The semiconductor device of claim 1, wherein the conductive grid comprises conductive grid members, wherein a first conductive grid member has a second width in the top view and the panel region has a third width in the top view, and wherein the second width is less than the third width.

9. A semiconductor device comprising:
a pad within a dielectric material, the pad comprising:
a panel region, the panel region having a continuous conductive top surface; and
a grid region surrounding the panel region in a top view, the grid region comprising conductive grid members, wherein a first one of the conductive grid members has a first thickness and the panel region has a second thickness, the first thickness being less than the second thickness, and wherein a first dielectric region is between the first one of the conductive grid members and a second one of the conductive grid members, wherein the first dielectric region has a first width and a first length in a top view, the first width being less than the first length; and
an active device within the dielectric material, wherein a top surface of the active device extends above a bottom surface of the pad and below a top surface of the pad.

10. The semiconductor device of claim 9, wherein a second dielectric region is between a third one of the conductive grid members and a fourth one of the conductive grid members, the second dielectric region having the first width and a second length, the second length being less than the first length.

11. The semiconductor device of claim 9, wherein a third dielectric region is between a fifth one of the conductive grid members and a sixth one of the conductive grid members, the third dielectric region having the first length and a second width, the second width being greater than the first width.

12. The semiconductor device of claim 9, wherein the panel region has a first dimension in a range of 10 µm to 30 µm and a second dimension in a range of 10 µm to 30 µm.

13. The semiconductor device of claim 9, wherein the pad has an area in a range of 400 µm² to 6400 µm².

14. The semiconductor device of claim 9, wherein the panel region has an area in a range of 78 µm² to 707 µm².

15. A semiconductor device comprising:
a dielectric material covering an active device;
a first test pad within the dielectric material, the first test pad comprising:
an outer frame;
a grid region extending inwards from the outer frame, the grid region comprising conductive grid members that are separated from one another by the dielectric material; and
a panel region within an interior of the grid region in a top view, a bottom surface of the panel region extending below a top surface of the active device in a cross-sectional view, wherein a first one of the conductive grid members connects the panel region to the outer frame, and wherein the first one of the conductive grid members has a first thickness and the panel region has a second thickness, the first thickness being less than the second thickness in the top view.

16. The semiconductor device of claim 15, wherein a second one of the conductive grid members has a third thickness, the third thickness being greater than the first thickness.

17. The semiconductor device of claim 16, wherein the dielectric material is between the panel region and the outer frame, a portion of the dielectric material being disposed between the first one of the conductive grid members and the second one of the conductive grid members.

18. The semiconductor device of claim 17, wherein the first one of the conductive grid members and the second one of the conductive grid members are each aligned in a first direction.

19. The semiconductor device of claim 17, further comprising a second test pad overlying the first test pad, the second test pad comprising a second outer frame, a second grid region, and a second panel region.

20. The semiconductor device of claim 17, further comprising a third one of the conductive grid members, wherein the third one of the conductive grid members is perpendicular to the first one of the conductive grid members in the top view.

* * * * *